United States Patent
Pugh et al.

(10) Patent No.: US 9,296,158 B2
(45) Date of Patent: *Mar. 29, 2016

(54) BINDER OF ENERGIZED COMPONENTS IN AN OPHTHALMIC LENS

(75) Inventors: Randall B. Pugh, Jacksonville, FL (US); Daniel B. Otts, Jacksonville, FL (US); Frederick A. Flitsch, New Windsor, NY (US)

(73) Assignee: Johnson & Johnson Vision Care, Inc., Jacksonville, FL (US)

(*) Notice: Subject to any disclaimer, the term of this patent is extended or adjusted under 35 U.S.C. 154(b) by 53 days.

This patent is subject to a terminal disclaimer.

(21) Appl. No.: 12/557,070

(22) Filed: Sep. 10, 2009

(65) Prior Publication Data

US 2010/0072643 A1  Mar. 25, 2010

Related U.S. Application Data

(63) Continuation-in-part of application No. 12/557,016, filed on Sep. 10, 2009, now abandoned.

(60) Provisional application No. 61/192,765, filed on Sep. 22, 2008.

(51) Int. Cl.
*B29D 11/00* (2006.01)
*G02C 7/04* (2006.01)
*G02C 7/08* (2006.01)

(52) U.S. Cl.
CPC .... *B29D 11/00038* (2013.01); *B29D 11/00826* (2013.01); *G02C 7/04* (2013.01); *G02C 7/083* (2013.01)

(58) Field of Classification Search
USPC ................................ 264/1.1, 1.36, 1.38, 1.7
IPC ............. B29D 11/00038,11/00826; G02C 7/04, G02C 7/083
See application file for complete search history.

(56) References Cited

U.S. PATENT DOCUMENTS

| | | | |
|---|---|---|---|
| 4,268,132 A | 5/1981 | Neefe | |
| 5,219,497 A | 6/1993 | Blum | |
| 5,682,210 A | 10/1997 | Weirich | |
| 6,217,171 B1 | 4/2001 | Auten et al. | |
| 6,364,482 B1 | 4/2002 | Roffman | |
| 6,638,304 B2 | 10/2003 | Azar | |
| 6,852,254 B2* | 2/2005 | Spaulding et al. | 264/1.36 |
| 7,794,643 B2 | 9/2010 | Watanabe | |
| 2004/0000732 A1* | 1/2004 | Spaulding et al. | 264/1.7 |
| 2004/0084790 A1 | 5/2004 | Blum | |
| 2005/0099594 A1* | 5/2005 | Blum et al. | 351/160 R |
| 2006/0181676 A1* | 8/2006 | Tucker et al. | 351/162 |

(Continued)

FOREIGN PATENT DOCUMENTS

| | | |
|---|---|---|
| EP | 1342560 A2 | 9/2003 |
| EP | 1342560 A3 | 11/2004 |

(Continued)

OTHER PUBLICATIONS

PCT International Search Report, dated Dec. 23, 2009, for PCT Int'l Appln. No. PCT/US2009/057289.

(Continued)

*Primary Examiner* — Mathieu Vargot

(57) ABSTRACT

This invention discloses methods and apparatus for providing an ophthalmic lens with an energy source incorporated therein.

28 Claims, 8 Drawing Sheets

(56) References Cited

U.S. PATENT DOCUMENTS

| | | |
|---|---|---|
| 2007/0231575 A1 | 10/2007 | Watanabe |
| 2008/0002149 A1 | 1/2008 | Fritsch |
| 2008/0208335 A1 | 8/2008 | Blum |
| 2010/0072643 A1 | 3/2010 | Pugh et al. |
| 2010/0079724 A1 | 4/2010 | Pugh et al. |

FOREIGN PATENT DOCUMENTS

| | | |
|---|---|---|
| EP | 1736291 A2 | 12/2006 |
| EP | 1747879 A2 | 1/2007 |
| EP | 1736291 A3 | 3/2007 |
| EP | 1747879 A3 | 3/2007 |
| EP | 1760515 A2 | 3/2007 |
| EP | 1849574 A2 | 10/2007 |
| EP | 1849589 A2 | 10/2007 |
| EP | 1342560 B1 | 7/2008 |
| EP | 1849589 A3 | 3/2009 |
| JP | 1286809 | 11/1989 |
| WO | WO 2007050402 A2 | 5/2007 |
| WO | WO 2008109867 A2 | 9/2008 |
| WO | WO 2009105261 A1 | 8/2009 |
| WO | WO 2010051225 A2 | 5/2010 |

OTHER PUBLICATIONS

PCT International Search Report dated May 4, 2010, for PCT Int'l Appln. No. PCT/US2009/057284.

Notification of Reasons for Rejection for Application No. 2011-527956 from the Japanese Patent Office dated Dec. 3, 2013.

PCT International Preliminary Report for patentability—Written Opinion for : PCT!US2013†023005.

* cited by examiner

BINDER OF ENERGIZED COMPONENTS IN AN OPHTHALMIC LENS

RELATED PATENT APPLICATIONS

This application claims priority to Provisional Patent Application U.S. Ser. No. 61/192,765 which was filed on Sep. 22, 2008, entitled "Energized Ophthalmic Lens" and also to U.S. patent application Ser. No. 12/557,016, filed Sep. 10, 2009, now abandoned entitled "Energized Ophthalmic Lens" as a Continuation-in-Part application, the contents of each are relied upon and incorporated by reference.

FIELD OF USE

The present invention relates to methods and apparatus for forming an energized ophthalmic lens and, more specifically, in some embodiments, methods of binding one or more of an energy source and components within an ophthalmic lens mold in order to facilitate the formation of the energized ophthalmic lens.

BACKGROUND

Traditionally an ophthalmic device, such as a contact lens, an intraocular lens or a punctal plug included a biocompatible device with a corrective, cosmetic or therapeutic quality. A contact lens, for example, can provide one or more of: vision correcting functionality; cosmetic enhancement; and therapeutic effects. Each function is provided by a physical characteristic of the lens. A design incorporating a refractive quality into a lens can provide a vision corrective function. A pigment incorporated into the lens can provide a cosmetic enhancement. An active agent incorporated into a lens can provide a therapeutic functionality. Such physical characteristics are accomplished without the lens entering into an energized state.

More recently, it has been theorized that active components may be incorporated into a contact lens. Some components can include semiconductor devices. Some examples have shown semiconductor devices embedded in a contact lens placed upon animal eyes. However, such devices lack a free standing energizing mechanism. Although wires may be run from a lens to a battery to power such semiconductor devices, and it has been theorized that the devices may be wirelessly powered, no mechanism for such wireless power has been available.

It is desirable therefore to have ophthalmic lenses that are energized to an extent suitable for providing one or more functionalities into an ophthalmic. In order to do so, methods and apparatus must be available for incorporating usable energy into an ophthalmic lens.

SUMMARY

Accordingly, the present invention includes a biomedical device, such as an ophthalmic lens, with an energized portion that has been incorporated into the ophthalmic lens via placement of an energy source on a binder layer in physical communication with a mold part used to form the ophthalmic lens. Some embodiments include a cast molded silicone hydrogel contact lens with a battery or other energy source contained within the ophthalmic lens in a biocompatible fashion. An energized portion is thereby created in the ophthalmic lens via inclusion of one or more batteries into the lens.

In some embodiments, components, such as semiconductor devices or devices which operate on electrical current may also be placed on the binder layer and held in position during formation of the ophthalmic lens and incorporated into the ophthalmic lens. In another aspect, in some embodiments, the energized device is capable of powering a semiconductor device incorporated into the ophthalmic lens.

Typically, the ophthalmic lenses are formed via the control of actinic radiation to which a reactive monomer mixture is exposed. The reactive monomer mixture surrounds the energy source and thereby incorporates the energy source within the lens.

DETAILED DESCRIPTION OF THE INVENTION

Glossary

Figure 1:
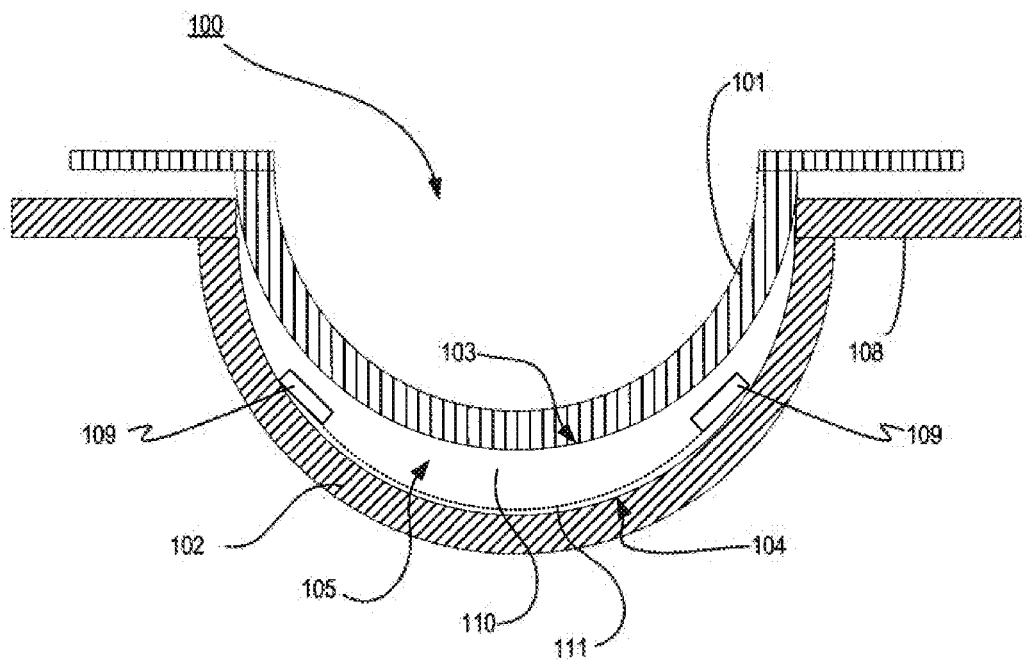
FIG. 1 illustrates an exemplary embodiment of a mold system that may be used in some implementations of the present invention.

In this description and claims directed to the presented invention, various terms may be used for which the following definitions will apply:

Energized: The state of being able to supply electrical current to or to have electrical energy stored within.

Energized Ophthalmic Lens: An energized ophthalmic lens refers to an ophthalmic lens with an Energy Source added onto or embedded within the formed lens.

Energy Source: A device capable of supplying energy or placing an ophthalmic lens in an energized state.

Energy Harvesters: A device capable of extracting energy from the environment and convert it to electrical energy.

Lens: As used herein "lens" refers to any ophthalmic device that resides in or on the eye. These devices can provide optical correction or may be cosmetic. For example, the term lens can refer to a contact lens, intraocular lens, overlay lens, ocular insert, optical insert or other similar device through which vision is corrected or modified, or through which eye physiology is cosmetically enhanced (e.g. iris color) without impeding vision. In some embodiments, the preferred lenses of the invention are soft contact lenses are made from silicone elastomers or hydrogels, which include but are not limited to silicone hydrogels.

Lens Forming Mixture: As used herein, the term "lens forming mixture" or "Reactive Mixture" or "RMM" (reactive monomer mixture) refers to a monomer or prepolymer material which can be cured and crosslinked or crosslinked to form an ophthalmic lens. Various embodiments can include lens forming mixtures with one or more additives such as: UV blockers, tints, photoinitiators or catalysts, and other additives one might desire in an ophthalmic lenses such as, contact or intraocular lenses.

Lithium Ion Cell: An electrochemical cell where Lithium ions move through the cell to generate electrical energy. This electrochemical cell, typically called a battery, may be reenergized or recharged in its typical forms.

Power: Work done or energy transferred per unit of time.

Rechargeable or Re-energizable: Capable of being restored to a state with higher capacity to do work. Many uses within this invention may relate to the capability of being restored with the ability to flow electrical current at a certain rate for a certain, reestablished time period.

Reenergize or Recharge: To restore to a state with higher capacity to do work. Many uses within this invention may relate to restoring a device to the capability to flow electrical current at a certain rate for a certain, reestablished time period.

In general, in the present invention, an Energy Source is embodied within an ophthalmic lens. In some embodiments, an ophthalmic device includes an optic zone through which a wearer of the lens would see. A pattern of components and an Energy Source can be located exterior to an optic zone. Other embodiments can include a pattern of conductive material and one or more Energy Sources which are small enough to not adversely affect the sight of a contact lens wearer and therefore can be located within, or exterior to, an optical zone.

In general, according to some embodiments of the present invention, an Energy Source is embodied within an ophthalmic lens.

Energized Ophthalmic Lens Device

Figure 4:
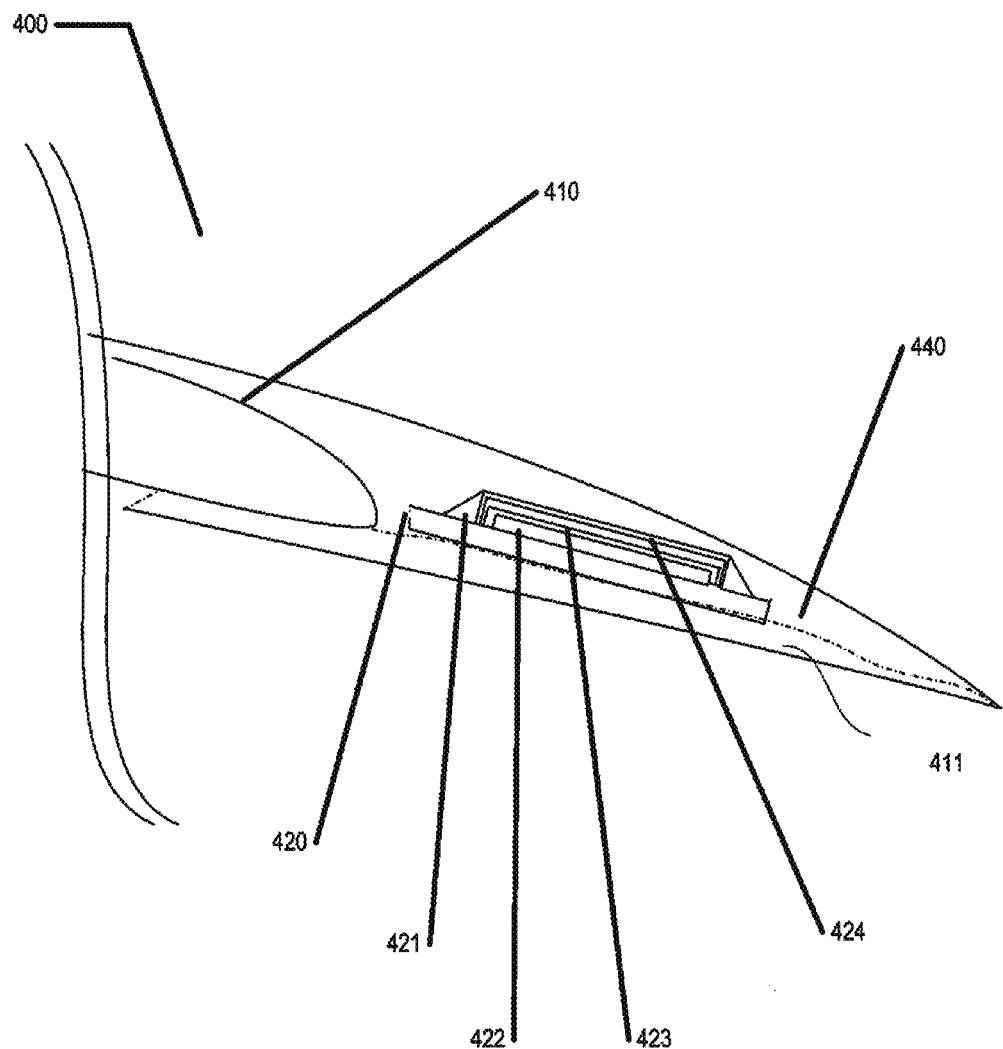
FIG. 4 illustrates an example of an energized ophthalmic lens in cross section.
Figure 5A:
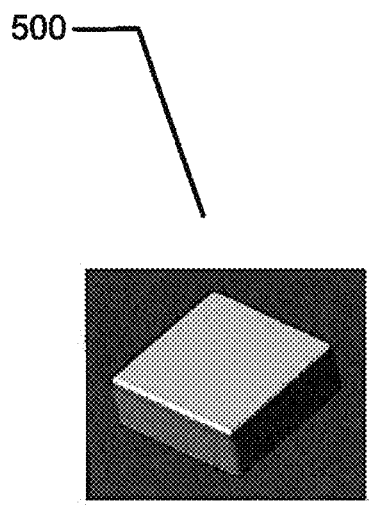
FIG. 5a-5d illustrates exemplary design shapes for energy sources.
Figure 5B:
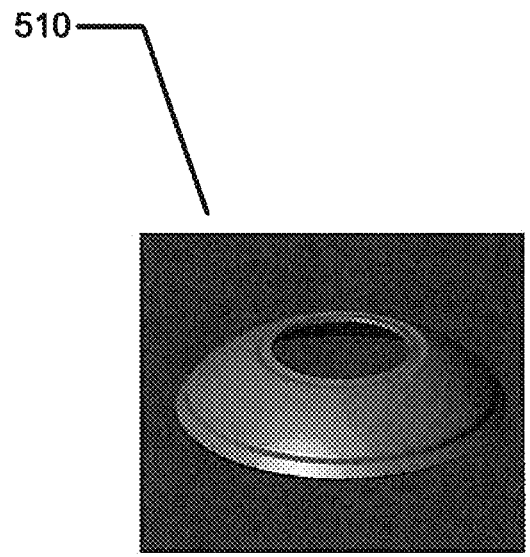
Figure 5C:
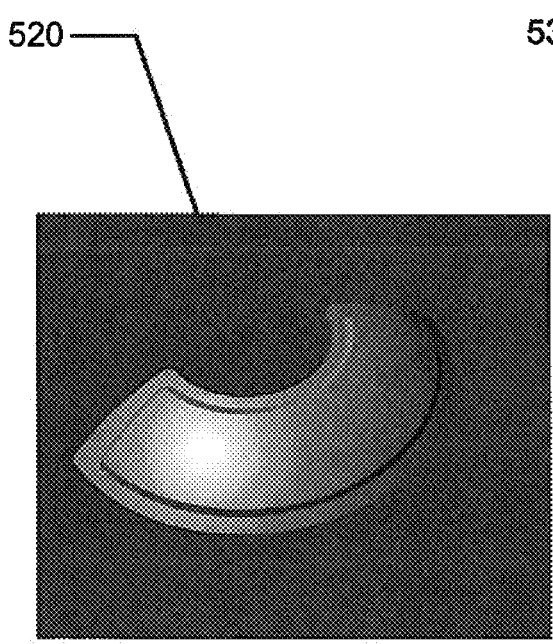
Figure 5D:
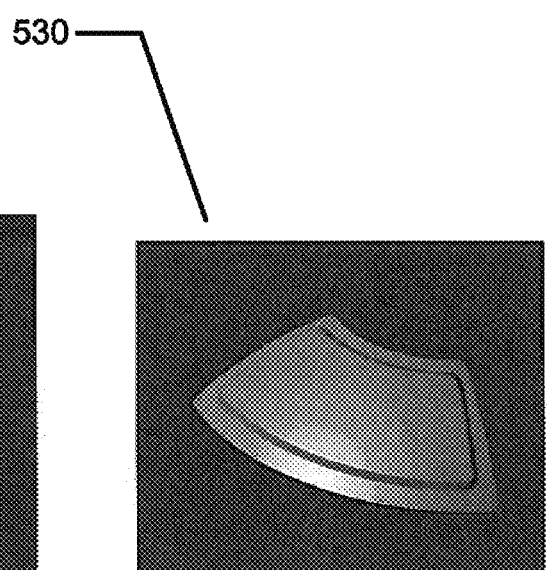

Referring first to FIG. 4, a cross section of an Energized Lens 400 is illustrated. This depiction provides a cross section of a general body of an ophthalmic lens 440. Within that body 440 is an Energy Source 420, such as a thin film battery with a substrate upon which it is built. Proceeding up from the substrate there may be a cathode layer 422 which may be surrounded by an electrolyte layer 423 which then may be coated by an anode layer 424. These layers may be surrounded by an encapsulating layer 421 that seals the battery layers from the external environment. In some exemplary embodiments an electronically controlled optic device 410 is also embedded with a lens and held in place during formation of the lens via a binder layer.

Referring now to FIG. 1, a mold system conducive to formation of an ophthalmic lens according to the present invention is illustrated. In this example, a mold part system 100 hydrogel material is formed into an ophthalmic lens which includes an Energy Source 109 embedded within hydrogel material 110. According to the present invention, the Energy Source 109 is secured via a binder layer 111 in a mold part while the energized lens 100 is formed by the hydrogel material. The energy Source may also include effective means of encapsulation and isolation of the materials it is made from and the environment as illustrated by a sealed encapsulating layer 130.

Some specific embodiments include an Energy Source which includes a lithium ion battery. Lithium ion batteries are generally rechargeable. According to the present invention, the lithium ion battery is in electrical communication with a charging device and also a power management circuit, both of which are embedded within the lens.

Additionally, some embodiments may include a binding an Energy Source 109 which includes a battery with thin film material materials and a flexible substrate to provide support for the thin film material. In the present invention, one or both of the Energy Source and the flexible substrate are secured in place during deposition of a Reactive Mixture and polymerization of the Reactive Mixture into an ophthalmic lens.

As used herein, the terms a mold includes a form 100 having a cavity 105 into which a lens forming mixture can be dispensed such that upon reaction or cure of the lens forming mixture, an ophthalmic lens of a desired shape is produced. The molds and mold assemblies 100 of this invention are made up of more than one "mold parts" or "mold pieces" 101-102. The mold parts 101-102 can be brought together such that a cavity 105 is formed between the mold parts 101-102 in which a lens can be formed. This combination of mold parts 101-102 is preferably temporary. Upon formation of the lens, the mold parts 101-102 can again be separated for removal of the lens.

At least one mold part 101-102 has at least a portion of its surface 103-104 in contact with the lens forming mixture such that upon reaction or cure of the lens forming mixture 110 that surface 103-104 provides a desired shape and form to the portion of the lens with which it is in contact. In some embodiments, the same is true of at least one other mold part 101-102, still other embodiments include a lens with a free form surface and is formed with only one mold part via voxel by voxel polymerization of a monomer mixture.

Thus, for example, in a preferred embodiment a mold assembly 100 is formed from two parts 101-102, a female concave piece (front piece) 102 and a male convex piece (back piece) 101 with a cavity formed between them. The portion of the concave surface 104 which makes contact with lens forming mixture has the curvature of the front curve of an ophthalmic lens to be produced in the mold assembly 100 and is sufficiently smooth and formed such that the surface of an ophthalmic lens formed by polymerization of the lens forming mixture which is in contact with the concave surface 104 is optically acceptable.

In some embodiments, the front mold piece 102 can also have an annular flange integral with and surrounding circular circumferential edge 108 and extends from it in a plane normal to the axis and extending from the flange (not shown).

A lens forming surface can include a surface 103-104 with an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

At 111, a binder layer is illustrated onto which an Energy Source 109 may be placed. The Binder layer 111 may also receive a flexible material or substrate onto which an Energy Source 109 has been mounted, in some embodiments the substrate may also include circuit paths, components and other aspects useful to use of the energy source. In some embodiments, the binder layer 111 can be a clear coat of a material which is incorporated into a lens when the lens is formed. The clear coat can include for example a pigment as described below, a monomer or other biocompatible material. Various embodiments can include an Energy Source which is placed on one or both of the optic zone and non-optic zone of a resulting lens. Still other embodiments can include an annular insert onto which an energy source is incorporated. The annular insert may be either rigid or formable or and circumvent an optic zone through which a user sees.

In some embodiments, the binding layer includes a polymer capable of forming an interpenetrating polymer network with a lens material, the need for formation of covalent bonds between the binder and lens material to form a stable lens is eliminated. Stability of a lens with an Energy Source placed into the binder is provided by entrapment of the Energy Source in the binding layer polymer and a lens base polymer. The binding polymers of the invention can include, for example, those made from a homopolymer or copolymer, or combinations thereof, having similar solubility parameters to each other and the binding polymer has similar solubility parameters to the lens material. Binding polymers may contain functional groups that render the polymers and copolymers of the binding polymer capable of interactions with each other. The functional groups can include groups of one polymer or copolymer interact with that of another in a manner that increases the density of the interactions helping to inhibit the mobility of and/or entrap the pigment particles. The interactions between the functional groups may be polar, dispersive, or of a charge transfer complex nature. The functional groups may be located on the polymer or copolymer backbones or be pendant from the backbones.

By way of non-limiting example, a monomer, or mixture of monomers, that form a polymer with a positive charge may be used in conjunction with a monomer or monomers that form a polymer with a negative charge to form the binding polymer. As a more specific example, methacrylic acid ("MAA") and 2-hydroxyethylmethacrylate ("HEMA") may be used to provide a MAA/HEMA copolymer that is then mixed with a HEMA/3-(N,N-dimethyl) propyl acrylamide copolymer to form the binding polymer.

As another example, the binding polymer may be composed of hydrophobically-modified monomers including, without limitation, amides and esters of the formula:

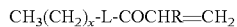

wherein L may be —NH or oxygen, x may be a whole number from 2 to 24, R may be a $C_1$ to $C_6$ alkyl or hydrogen and preferably is methyl or hydrogen. Examples of such amides and esters include, without limitation, lauryl methacrylamide, and hexyl methacrylate. As yet another example, polymers of aliphatic chain extended carbamates and ureas may be used to form the binding polymer.

Binding polymers suitable for a binding layer may also include a random block copolymer of HEMA, MAA and lauryl methacrylate ("LMA"), a random block copolymer of HEMA and MAA or HEMA and LMA, or a homopolymer of HEMA. The weight percentages, based on the total weight of the binding polymer, of each component in these embodiments is about 93 to about 100 weight percent HEMA, about 0 to about 2 weight percent MAA, and about 0 to about 5 weight percent LMA.

The molecular weight of the binding polymer can be such that it is somewhat soluble in the lens material and swells in it. The lens material diffuses into the binding polymer and is polymerized and/or cross-linked. However, at the same time, the molecular weight of the binding polymer cannot be so high as to impact the quality of the printed image. Preferably, the molecular weight of the binding polymer is about 7,000 to about 100,000, more preferably about 7,000 to about 40,000, most preferably about 17,000 to about 35,000 $M_{peak}$ which corresponds to the molecular weight of the highest peak in the SEC analyses $(=(M_n \times M_w)^{1/2})$ For purposes of the invention, the molecular weight can be determined using a gel permeation chromatograph with a 90° light scattering and refractive index detectors. Two columns of PW4000 and PW2500, a methanol-water eluent of 75/25 wt/wt adjusted to 50 mM sodium chloride and a mixture of polyethylene glycol and polyethylene oxide molecules with well defined molecular weights ranging from 325,000 to 194 are used.

One ordinarily skilled in the art will recognize that, by using chain transfer agents in the production of the binding polymer, by using large amounts of initiator, by using living polymerization, by selection of appropriate monomer and initiator concentrations, by selection of amounts and types of solvent, or combinations thereof, the desired binding polymer molecular weight may be obtained. Preferably, a chain transfer agent is used in conjunction with an initiator, or more preferably with an initiator and one or more solvents to achieve the desired molecular weight. Alternatively, small amounts of very high molecular weight binding polymer may be used in conjunction with large amounts of solvent to maintain a desired viscosity for the binding polymer. Preferably, the viscosity of the binding polymer will be about 4,000 to about 15,000 centipoise at 23° C.

Chain transfer agents useful in forming the binding polymers used in the invention have chain transfer constants values of greater than about 0.01, preferably greater than about 7, and more preferably greater than about 25,000.

Any desirable initiators may be used including, without limitation, ultra-violet, visible light, thermal initiators and the like and combinations thereof. Preferably, a thermal initiator is used, more preferably 2,2-azobis isobutyronitrile and 2,2-azobis 2-methylbutyronitrile. The amount of initiator used will be about 0.1 to about 5 weight percent based on the total weight of the formulation. Preferably, 2,2-azobis 2-methyl-butyronitrile is used with dodecanethiol.

A binding polymer layer or other media may be made by any convenient polymerization process including, without limitation, radical chain polymerization, step polymerization, emulsion polymerization, ionic chain polymerization, ring opening, group transfer polymerization, atom transfer polymerization, and the like. Preferably, a thermal-initiated, free-radical polymerization is used. Conditions for carrying out the polymerization are within the knowledge of one ordinarily skilled in the art.

Solvents useful in the production of the binding polymer are medium boiling solvents having boiling points between about 120 and 230° C. Selection of the solvent to be used will be based on the type of binding polymer to be produced and its molecular weight. Suitable solvents include, without limitation, diacetone alcohol, cyclohexanone, isopropyl lactate, 3-methoxy 1-butanol, 1-ethoxy-2-propanol, and the like.

In some embodiments, a binding polymer layer 111 of the invention may be tailored, in terms of expansion factor in water, to the lens material with which it will be used. Matching, or substantially matching, the expansion factor of the binding polymer with that of the cured lens material in packing solution may facilitate the avoidance of development of stresses within the lens that result in poor optics and lens parameter shifts. Additionally, the binding polymer can be swellable in the lens material, permitting swelling of the image printed using the colorant of the invention. Due to this swelling, the image becomes entrapped within the lens material without any impact on lens comfort.

In some embodiments, colorants may be included in the binding layer. Pigments useful with the binding polymer in the colorants of the invention are those organic or inorganic pigments suitable for use in contact lenses, or combinations of such pigments. The opacity may be controlled by varying the concentration of the pigment and opacifying agent used, with higher amounts yielding greater opacity. Illustrative organic pigments include, without limitation, pthalocyanine blue, pthalocyanine green, carbazole violet, vat orange #1, and the like and combinations thereof. Examples of useful inorganic pigments include, without limitation, iron oxide black, iron oxide brown, iron oxide yellow, iron oxide red, titanium dioxide, and the like, and combinations thereof. In addition to these pigments, soluble and non-soluble dyes may be used including, without limitation, dichlorotriazine and vinyl sulfone-based dyes. Useful dyes and pigments are commercially available.

Colors may be arranged for example in a pattern to mask components present in a lens according to the present invention. For example, opaque colors can simulate the appearance of a natural eye and cover up the presence of components within a lens.

In addition, in some embodiments, the binding layer contains one or more solvents that aid in coating of the binding layer onto the mold part. It is another discovery of the invention that, to facilitate a binding layer that does not bleed or run on the mold part surface to which it is applied, it is desirable, and preferred, that the binding layer have a surface tension below about 27 mN/m. This surface tension may be achieved by treatment of the surface, for example a mold surface, to which the binding layer will be applied. Surface treatments may be effected by methods known in the art, such as, but not limited to plasma and corona treatments. Alternatively, and preferably, the desired surface tension may be achieved by the choice of solvents used in the colorant.

Accordingly, exemplary solvents useful in the binding layer include those solvents that are capable of increasing or decreasing the viscosity of the binding layer and aiding in controlling the surface tension. Suitable solvents include, without limitation, cyclopentanones, 4-methyl-2-pentanone, 1-methoxy-2-propanol, 1-ethoxy-2-propanol, isopropyl lactate and the like and combinations thereof. Preferably, 1-ethoxy-2-propanol and isopropyl lactate are used.

In some preferred embodiments, at least three different solvents are used in the binding layer material of the invention. The first two of these solvents, both medium boiling point solvents, are used in the production of the binding polymer. Although these solvents may be stripped from the binding polymer after its formation, it is preferred that they are retained. Preferably, the two solvents are 1-ethoxy-2-propanol and isopropyl lactate. An additional low boiling solvent, meaning a solvent the boiling point of which is between about 75 and about 120° C., can be used to decrease the viscosity of the colorant as desired. Suitable low boiling solvents include, without limitation, 2-propanol, 1-methoxy-2-propanol, 1-propanol, and the like and combinations thereof. Preferably, 1-propanol is used.

The specific amount of solvents used can depend on a number of factors. For example, the amount of solvents used in forming the binding polymer will depend upon the molecular weight of the binding polymer desired and the constituents, such as the monomers and copolymers, used in the binding polymer. The amount of low boiling solvent used will depend upon the viscosity and surface tension desired for the colorant. Further, if the colorant is to be applied to a mold and cured with a lens material, the amount of solvent used will depend upon the lens and mold materials used and whether the mold material has undergone any surface treatment to increase its wettability. Determination of the precise amount of solvent to be used is within the skill of one ordinarily skilled in the art. Generally, the total weight of the solvents used will be about 40 to about 75 weight percent of solvent will be used.

In addition to the solvents, a plasticizer may be and, preferably is, added to the binding layer to reduce cracking during the drying of the binding layer and to enhance the diffusion and swelling of the binding layer by the lens material. The type and amount of plasticizer used will depend on the molecular weight of the binding polymer used and, for colorants placed onto molds that are stored prior to use, the shelf-life stability desired. Useful plasticizers include, without limitation, glycerol, propylene glycol, dipropylene glycol, tripropylene glycol, polyethylene glycol 200, 400, or 600, and the like and combinations thereof. Preferably, glycerol is used. Amounts of plasticizer used generally will be 0 to about 10 weight percent based on the weight of the colorant.

One ordinarily skilled in the art will recognize that additives other than those discussed also may be included in the binding layer composition of the invention. Suitable additives include, without limitation, additives that aid flow and leveling, additives for foam prevention, additives for rheology modification, and the like, and combinations thereof.

In some embodiments of the present invention, the binding layer becomes embedded in the lens material upon curing of the lens material. Thus, the binding layer may embed closer to the front or back surface of the lens formed depending on the surface of the mold to which the lens the binding layer is applied. Additionally, one or more layers of binding layer may be applied in any order.

Although invention may be used to provide hard or soft contact lenses made of any known lens material, or material suitable for manufacturing such lenses, preferably, the lenses of the invention are soft contact lenses having water contents of about 0 to about 90 percent. More preferably, the lenses are made of monomers containing hydroxy groups, carboxyl groups, or both or be made from silicone-containing polymers, such as siloxanes, hydrogels, silicone hydrogels, and combinations thereof. Material useful for forming the lenses of the invention may be made by reacting blends of macromers, monomers, and combinations thereof along with additives such as polymerization initiators. Suitable materials include, without limitation, silicone hydrogels made from silicone macromers and hydrophilic monomers.

Additional embodiments may come from the nature in which the internal components are encapsulated by the encapsulating material. It may be possible to coat an Energy Source in a manner that involves a seam between two layers of encapsulant. Alternatively the encapsulant may be applied in such a manner to not generate seams, although it should be noted that many embodiments would require the Energy Source to provide two distinct and isolated electrical contact points. It may be obvious to one skilled in the art that there are various other means to encapsulate an Energy Source which may be consistent with the art detailed herein.

Mold part 101-102 material can include, for example: a polyolefin of one or more of: polypropylene, polystyrene, polyethylene, polymethyl methacrylate, and modified polyolefins. Other molds can include a ceramic or metallic material.

A preferred alicyclic co-polymer contains two different alicyclic polymers and is sold by Zeon Chemicals L.P. under the trade name ZEONOR. There are several different grades of ZEONOR. Various grades may have glass transition temperatures ranging from 105° C. to 160° C. A specifically preferred material is ZEONOR 1060R.

Other mold materials that may be combined with one or more additives to form an ophthalmic lens mold include, for example, Zieglar-Natta polypropylene resins (sometimes referred to as znPP). On exemplary Zieglar-Natta polypropylene resin is available under the name PP 9544 MED. PP 9544 MED is a clarified random copolymer for clean molding as per FDA regulation 21 CFR (c) 3.2 made available by ExxonMobile Chemical Company. PP 9544 MED is a random copolymer (znPP) with ethylene group (hereinafter 9544 MED). Other exemplary Zieglar-Natta polypropylene resins include: Atofina Polypropylene 3761 and Atofina Polypropylene 3620WZ.

Still further, in some embodiments, the molds of the invention may contain polymers such as polypropylene, polyethylene, polystyrene, polymethyl methacrylate, modified polyolefins containing an alicyclic moiety in the main chain and cyclic polyolefins. This blend can be used on either or both mold halves, where it is preferred that this blend is used on the back curve and the front curve consists of the alicyclic co-polymers.

In some preferred methods of making molds 100 according to the present invention, injection molding is utilized according to known techniques, however, embodiments can also include molds fashioned by other techniques including, for example: lathing, diamond turning, or laser cutting.

Typically, lenses are formed on at least one surface of both mold parts 101-102. However, in some embodiments, one surface of a lens may be formed from a mold part 101-102 and another surface of a lens can be formed using a lathing method, or other methods.

Figure 2:
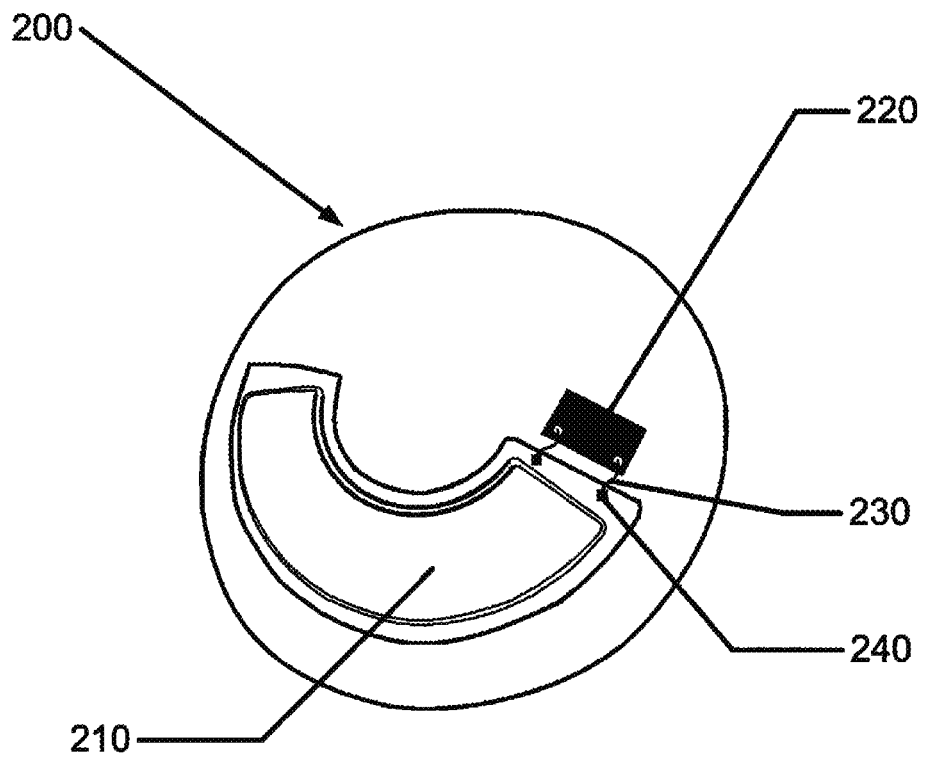
FIG. 2 illustrates an exemplary embodiment of an energized ophthalmic lens including a device for reenergization.

Referring now to FIG. 2, in some embodiments, an Energized Lens 200 includes an Energy Source 210 with two contact points 240. In some embodiments, contact points 240 include two electrically conductive wires 230 affixed to them to conduct the energy from the Energy Source 210 to another device 220.

The manner by which the electrical wires 230 may be connected to the contact points 240 may form numerous embodiments within this art. In some embodiments, these wires may be affixed by a wire bonding technique which will physically scrub a wire into an electrical contact with an alternative bond pad metal. Still other embodiments may derive from melting a contacting metallurgy between the wire 230 and the contact point 240 for example with a solder technique. It may be possible in other embodiments to evaporatively deposit the connecting wires 230 to the contact point 240. In still other embodiments, conductive epoxies or inks may be used to define the conducting element 230 and to connect it to the contact points 240. It may be obvious to one skilled in the art that numerous means of making a connection to the contact point of an Energy Source to convey energy to or from another device may comprise embodiments within the scope of this invention.

As previously discussed, an Energy Source 200 may include a composite of two or more of the types of Energy Sources that have been described. For example, the Energy Source in FIG. 2 may be comprised of a rechargeable lithium ion thin film battery 210 that is combined with a device 220, such as a photocell. Numerous photocell types may be consistent with the art herein, as an example a photovoltaic device that could be used for this embodiment is the CPC1822 manufactured by Clare, Inc. (Beverly, Mass.), which measures approximately 2.5 mm×1.8 mm×0.3 mm in die form and is capable of providing 4 volts of direct current electricity (VDC) in light conditions. In some embodiments, the output of the photovoltaic device may be directly provided to the battery as demonstrated in FIG. 2. Alternatively, a power management device may control the charging of the rechargeable battery with a reenergizing device of some kind. This specific example is provided in a non-limiting sense as there may be numerous embodiments of reenergizing an Energy Source within the scope of this inventive art on energized ophthalmic lenses.

In the case of the Clare photovoltaic cell, an external light source may comprise the manner to reenergize another attached Energy Source. In light intensities on the order of one sun or more, the cell provides significant charging current. There may be numerous manners to configure a reenergizing system to interact with such a photovoltaic device. By nonlimiting example, it may be possible to provide light of appropriate intensity during the storage of an ophthalmic lens in hydration media.

Other embodiments of reenergizing an Energy Source may be defined by alternative devices. For example, a thermal gradient across the ophthalmic lens body may be used by a thermoelectric device to provide reenergization to an Energy Source. In alternative embodiments, external energy may be coupled into the ophthalmic lens with use of an external radiofrequency signal and an absorbing device in the lens; an external voltage field and a capacitive coupling device in the lens; or mechanical energy or pressure and a piezoelectric device. It may be obvious to one skilled in the art that there may be numerous manners of reenergizing an Energy Source in an energized ophthalmic lens.

As mentioned in the earlier discussion, non-rechargeable chemistries of battery type Energy Sources may provide alternative embodiments of the novelty disclosed herein. While potentially lacking some of the advantages of rechargeability, such embodiments may alternatively have potential cost and implementation advantages. It may be considered within the scope of this disclosure to include non-rechargeable encapsulated electrochemical cells in equivalent manners to the rechargeable Energy Sources that have been disclosed herein.

The various Energy Sources of the present invention provide an "on board" power source within the ophthalmic lens which may be used in conjunction with electronic components, flexible circuit interconnect substrates, printed electrical interconnects, sensors, and/or other custom active components. These various components that may be energized may define embodiments that perform a broad range of functions. By way of non-limiting examples, an energized ophthalmic lens may be an electro-optic device energizing functionality to adjust the focal characteristics of an ophthalmic lens. In still other embodiments, the energized function may activate a pumping mechanism within the ophthalmic lens that may pump pharmaceuticals or other materials. Still further energized function may involve sensing devices and communication devices within an ophthalmic lens. It may be obvious to one skill in the art that there are an abundant range of embodiments relating to the function that may be enabled within an energized ophthalmic lens.

In some embodiments the Energy Source within an energized ophthalmic lens may energize a control function within the ophthalmic lens to provide for the wireless, controlled activation of still further energized function within an ophthalmic lens or other shaped hydrogel article. By way of non-limiting example, the Energy Source may comprise an embedded encapsulated thin film microbattery which may have a finite, limited maximum current capacity. In order to minimize leakage currents, or quiescent current draw so that a fully charged thin film microbattery will maintain its charge as long as possible during storage, various means to activate or electrically connect the microbattery to other components within the electroactive lens may be utilized. In some embodiments, a photovoltaic cell (e.g. Clare CPC1822 in die form) or a photoelectric sensing device may activate transistors or other microelectronic components within the lens under prescribed lighting conditions that can then activate the interconnection of the battery with other microelectronic components within the lens. In another embodiment, a micro-sized hall-effect sensor/switch such as the A1172 manufactured by Allegro Microsystems, Inc. (Worcester, Mass.) may be used to activate the battery and/or other microelectronic components within the lens when exposed to a north and/or south pole of a magnet. In other embodiments, physical contact switches, membrane switches, RF switches, temperature sensors, photodiodes, photoresistors, phototransistors, or optical sensors may be used to activate the battery and/or attached electronics within the energized ophthalmic lens.

In some embodiments an Energy Source within an energized ophthalmic lens may be incorporated alongside integrated circuits. In exemplary embodiments of this type, incorporation of planar thin film microbatteries on silicon substrates could be envisioned in conjunction with the semiconductor fabrication process. Such approaches could advantageously be used to provide separate power sources for various integrated circuits which may be incorporated into the electroactive lens of the present invention. In alternative embodiments the integrate circuit may be incorporated as a distinct component of the energized lens.

Figure 3:
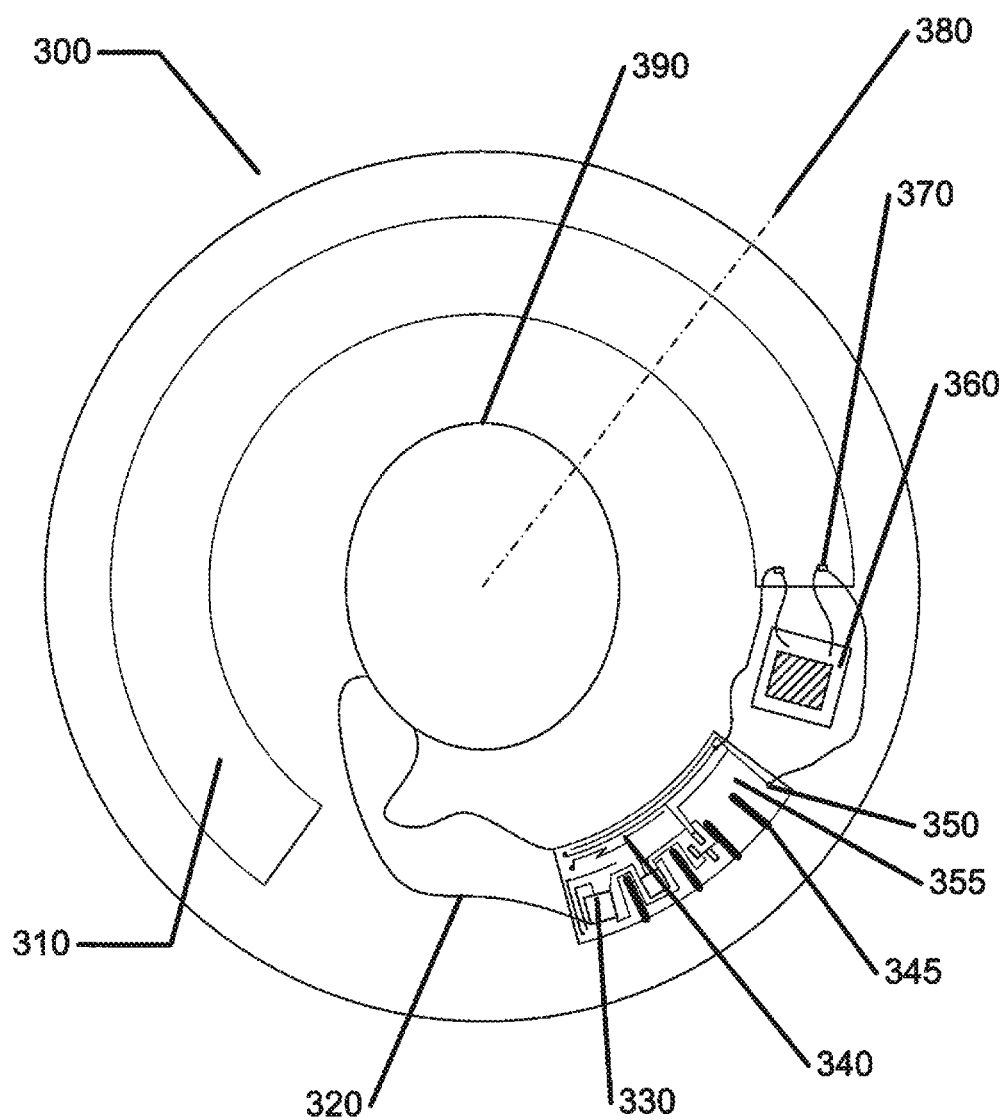
FIG. 3 illustrates an example of an energized ophthalmic lens with a device for reenergization and an energized component.

Referring to FIG. 3, item 300 a depiction of an exemplary embodiment of an energized ophthalmic lens is shown. In this depiction, the Energy Source 310 may include a thin film, rechargeable lithium ion battery. The battery may have contact points 370 to allow for interconnection. Wires may be wire bond wires to the contact points 370 and connect the battery to a photoelectric cell 360 which may be used to reenergize the battery Energy Source 310. Additional wires may connect the Energy Source to a flexible circuit interconnect via wire bonded contacts on a second set of contact points 350. These contact points 350 may be a portion of a flexible interconnect substrate 355. This interconnect substrate may be formed into a shape approximating a typical lens form in a similar manner to the Energy Source previously discussed. To add additional flexibility, an interconnect substrate 355 may include additional shape features such as radial cuts 345 along its length. On individual flaps of the interconnect substrate 355 may be connected various electronic components like ICs, discrete components, passive components and such devices which are shown as item 330. These components are interconnected by wires or other connection means 340 to the conduction paths within the interconnect substrate 355. By way of non-limiting example, the various components may be connected to the flexible interconnect substrate 355 by the various means that interconnections to the battery already discussed may be made. The combination of the various electrical components may define a control signal for an electro-optical device shown as item 390. This control signal may be conducted along interconnect 320. This type of exemplary energized ophthalmic lens with energized function is provided only for the purpose of example. In no way should this description be construed to limit the scope of the inventive art as it may be apparent to one skilled in the arts that many different embodiments of function, design, interconnection scheme, energization scheme and overall utilization of the concepts of this invention may exist.

Referring now to FIG. 5, in FIGS. 5a, 5b, 5c and 5d are numerous examples of different shapes that an Energy Source in an ophthalmic lens may take. Item 500 shows a reference Energy Source made of thin film materials, which for reference is formed as a flat shape. When the dimension of such a shape 500 is approximately a millimeter or less, it may comprise an Energy Source for an energized ophthalmic lens. Item 510 shows an exemplary three dimensional form where the flexible substrate and encapsulated battery assume a full annular shape, which when not flexibly distorted is roughly the same shape that an undistorted ophthalmic lens may assume. In some embodiments, the radius of the annular shape may approximate eight millimeters for an energized ophthalmic lens embodiment. The same three-dimensional aspect may be shared by embodiments which are quarter annulus 530, half annulus 520 or other arcuate shape. It may be apparent to one skilled in the arts that many different shapes including other partial annular shapes may comprise alternative embodiments within the scope of this invention. In some embodiments, rectangular, planar shapes may also be fit into a semi-spherical shell geometry included in an ophthalmic lens.

Another set of embodiments of the present invention relate to specific battery chemistries which may be advantageously utilized in an energized ophthalmic lens. An example embodiment, which was developed by Oak Ridge Laboratories, comprises constituents of a Lithium or Lithium-Ion Cell. Common materials for the anode of such cells include Lithium metal or alternatively for the Lithium Ion Cell include graphite. An example alternative embodiment of these cells would be the incorporation of micro-scaled silicon features to act as the anode of such a thin film battery incorporated into a contact lens.

The materials used for the cathode of the batteries may include Lithium Manganese Oxide and Lithium Cobalt Oxide which have good performance metrics for the batteries thus formed. Alternatively, Lithium Iron Phosphide cathodes, can have similar performance, however, may in some applications have improved aspects relating to charging. As well, the dimension of these and other cathode materials can improve charging performance; as for example, forming the cathode from nano-scaled crystals of the various materials can dramatically improve the rate that the battery may be recharged at.

Various materials that may be included as constituents of an Energy Source may be preferably encapsulated. It may be desirable to encapsulate the Energy Source to generally isolate its constituents from entering the ophthalmic environment. Alternatively, aspects of the ophthalmic environment may negatively affect the performance of Energy Sources if they are not properly isolated by an encapsulation embodiment. Various embodiments of the inventive art may derive from the choice of materials.

Accordingly, in some embodiments, a lens material can include a silicone containing component. A "silicone-containing component" is one that contains at least one [—Si—O—] unit in a monomer, macromer or prepolymer. Preferably, the total Si and attached O are present in the silicone-containing component in an amount greater than about 20 weight percent, and more preferably greater than 30 weight percent of the total molecular weight of the silicone-containing component. Useful silicone-containing components preferably comprise polymerizable functional groups such as acrylate, methacrylate, acrylamide, methacrylamide, vinyl, N-vinyl lactam, N-vinylamide, and styryl functional groups.

Suitable silicone containing components include compounds of Formula I

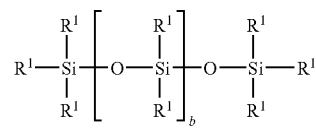

where $R^1$ is independently selected from monovalent reactive groups, monovalent alkyl groups, or monovalent aryl groups, any of the foregoing which may further comprise functionality selected from hydroxy, amino, oxa, carboxy, alkyl carboxy, alkoxy, amido, carbamate, carbonate, halogen or combinations thereof; and monovalent siloxane chains comprising 1-100 Si—O repeat units which may further comprise functionality selected from alkyl, hydroxy, amino, oxa, carboxy, alkyl carboxy, alkoxy, amido, carbamate, halogen or combinations thereof;

where b=0 to 500, where it is understood that when b is other than 0, b is a distribution having a mode equal to a stated value;

wherein at least one $R^1$ comprises a monovalent reactive group, and in some embodiments between one and 3 $R^1$ comprise monovalent reactive groups.

As used herein "monovalent reactive groups" are groups that can undergo free radical and/or cationic polymerization. Non-limiting examples of free radical reactive groups include (meth)acrylates, styryls, vinyls, vinyl ethers, $C_{1-6}$alkyl(meth)acrylates, (meth)acrylamides, $C_{1-6}$alkyl(meth)acrylamides, N-vinyllactams, N-vinylamides, $C_{2-12}$alkenyls, $C_{2-12}$alkenylphenyls, $C_{2-12}$alkenylnaphthyls, $C_{2-6}$alkenylphenyl$C_{1-6}$alkyls, O-vinylcarbamates and O-vinylcarbonates. Non-limiting examples of cationic reactive groups include vinyl ethers or epoxide groups and mixtures thereof. In one embodiment the free radical reactive groups comprises (meth)acrylate, acryloxy, (meth)acrylamide, and mixtures thereof.

Suitable monovalent alkyl and aryl groups include unsubstituted monovalent $C_1$ to $C_{16}$alkyl groups, $C_6$-$C_{14}$ aryl groups, such as substituted and unsubstituted methyl, ethyl, propyl, butyl, 2-hydroxypropyl, propoxypropyl, polyethyleneoxypropyl, combinations thereof and the like.

In one embodiment b is zero, one $R^1$ is a monovalent reactive group, and at least 3 $R^1$ are selected from monovalent alkyl groups having one to 16 carbon atoms, and in another embodiment from monovalent alkyl groups having one to 6 carbon atoms. Non-limiting examples of silicone components of this embodiment include 2-methyl-,2-hydroxy-3-[3-[1,3,3,3-tetramethyl-1-[(trimethylsilyl)oxy]disiloxanyl]propoxy]propyl ester ("SiGMA"), 2-hydroxy-3-methacryloxypropyloxypropyl-tris(trimethylsiloxy)silane, 3-methacryloxypropyltris(trimethylsiloxy)silane ("TRIS"), 3-methacryloxypropylbis(trimethylsiloxy)methylsilane and 3-methacryloxypropylpentamethyl disiloxane.

In another embodiment, b is 2 to 20, 3 to 15 or in some embodiments 3 to 10; at least one terminal $R^1$ comprises a monovalent reactive group and the remaining $R^1$ are selected from monovalent alkyl groups having 1 to 16 carbon atoms, and in another embodiment from monovalent alkyl groups having 1 to 6 carbon atoms. In yet another embodiment, b is 3 to 15, one terminal $R^1$ comprises a monovalent reactive group, the other terminal $R^1$ comprises a monovalent alkyl group having 1 to 6 carbon atoms and the remaining $R^1$ comprise monovalent alkyl group having 1 to 3 carbon atoms. Non-limiting examples of silicone components of this embodiment include (mono-(2-hydroxy-3-methacryloxypropyl)-propyl ether terminated polydimethylsiloxane (400-1000 MW)) ("OH-mPDMS"), monomethacryloxypropyl terminated mono-n-butyl terminated polydimethylsiloxanes (800-1000 MW), ("mPDMS").

In another embodiment b is 5 to 400 or from 10 to 300, both terminal $R^1$ comprise monovalent reactive groups and the remaining $R^1$ are independently selected from monovalent alkyl groups having 1 to 18 carbon atoms which may have ether linkages between carbon atoms and may further comprise halogen.

In one embodiment, where a silicone hydrogel lens is desired, the lens of the present invention will be made from a reactive mixture comprising at least about 20 and preferably between about 20 and 70% wt silicone containing components based on total weight of reactive monomer components from which the polymer is made.

In another embodiment, one to four $R^1$ comprises a vinyl carbonate or carbamate of the formula:

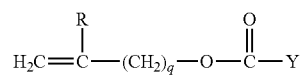

Formula II wherein: Y denotes O—, S— or NH—;
R denotes, hydrogen or methyl; d is 1, 2, 3 or 4; and q is 0 or 1.

The silicone-containing vinyl carbonate or vinyl carbamate monomers specifically include: 1,3-bis[4-(vinyloxycarbonyloxy)but-1-yl]tetramethyl-disiloxane; 3-(vinyloxycarbonylthio)propyl-[tris(trimethylsiloxy)silane]; 3-[tris(trimethylsiloxy)silyl]propyl allyl carbamate; 3-[tris(trimethylsiloxy)silyl] propyl vinyl carbamate; trimethylsilylethyl vinyl carbonate; trimethylsilylmethyl vinyl carbonate, and

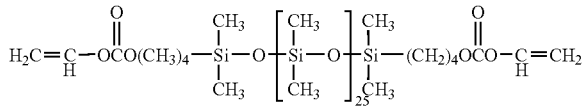

Where biomedical devices with modulus below about 200 are desired, only one $R^1$ shall comprise a monovalent reactive group and no more than two of the remaining $R^1$ groups will comprise monovalent siloxane groups.

Another class of silicone-containing components includes polyurethane macromers of the following formulae:

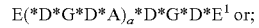

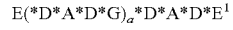   Formulae IV-VI wherein:
D denotes an alkyl diradical, an alkyl cycloalkyl diradical, a cycloalkyl diradical, an aryl diradical or an alkylaryl diradical having 6 to 30 carbon atoms, G denotes an alkyl diradical, a cycloalkyl diradical, an alkyl cycloalkyl diradical, an aryl diradical or an alkylaryl diradical having 1 to 40 carbon atoms and which may contain ether, thio or amine linkages in the main chain;

* denotes a urethane or ureido linkage;

$_a$ is at least 1;

A denotes a divalent polymeric radical of formula:

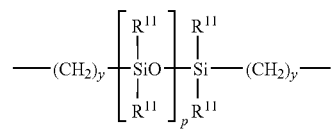

Formula VII $R^{11}$ independently denotes an alkyl or fluoro-substituted alkyl group having 1 to 10 carbon atoms which may contain ether linkages between carbon atoms; y is at least 1; and p provides a moiety weight of 400 to 10,000; each of E and $E^1$ independently denotes a polymerizable unsaturated organic radical represented by formula:

Formula VIII

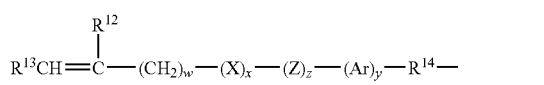

wherein: $R^{12}$ is hydrogen or methyl; $R^{13}$ is hydrogen, an alkyl radical having 1 to 6 carbon atoms, or a —CO—Y—$R^{15}$ radical wherein Y is —O—, Y—S— or —NH—; $R^{14}$ is a divalent radical having 1 to 12 carbon atoms; X denotes —CO— or —OCO—; Z denotes —O— or —NH—; Ar denotes an aromatic radical having 6 to 30 carbon atoms; w is 0 to 6; x is 0 or 1; y is 0 or 1; and z is 0 or 1.

A preferred silicone-containing component is a polyurethane macromer represented by the following formula:

ysiloxanes with a polar fluorinated graft or side group having a hydrogen atom attached to a terminal difluoro-substituted carbon atom; hydrophilic siloxanyl methacrylates containing ether and siloxanyl linkanges and crosslinkable monomers containing polyether and polysiloxanyl groups. Any of the foregoing polysiloxanes can also be used as the silicone containing component in this invention.

Although invention may be used to provide hard or soft contact lenses made of any known lens material, or material suitable for manufacturing such lenses, preferably, the lenses of the invention are soft contact lenses having water contents of about 0 to about 90 percent. More preferably, the lenses are made of monomers containing hydroxy groups, carboxyl groups, or both or be made from silicone-containing polymers, such as siloxanes, hydrogels, silicone hydrogels, and combinations thereof. Material useful for forming the lenses of the invention may be made by reacting blends of macromers, monomers, and combinations thereof along with additives such as polymerization initiators. Suitable materials include, without limitation, silicone hydrogels made from silicone macromers and hydrophilic monomers.

Formula IX

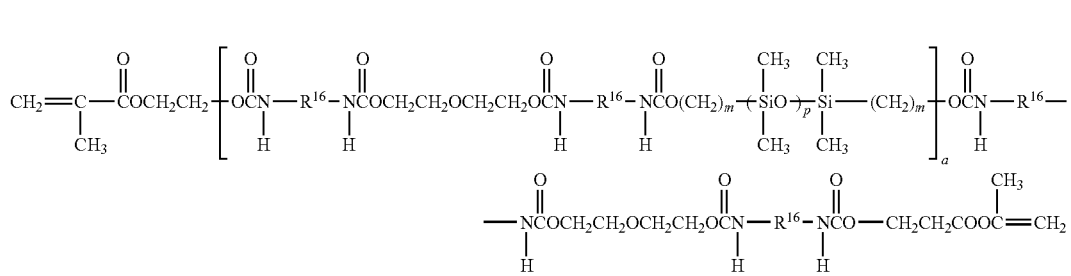

wherein $R^{16}$ is a diradical of a disocyanate after removal of the isocyanate group, such as the diradical of isophorone diisocyanate. Another suitable silicone containing macromer is compound of formula X (in which x+y is a number in the range of 10 to 30) formed by the reaction of fluoroether, hydroxy-terminated polydimethylsiloxane, isophorone diisocyanate and isocyanatoethylmethacrylate.

Additional embodiments are related to the nature in which the internal components are encapsulated by the encapsulating material. It may be possible to coat an Energy Source in a manner that involves a seam between two layers of encapsulant. Alternatively the encapsulant may be applied in such a manner to not generate seams, although it should be noted that many embodiments would require the Energy Source to Formula X

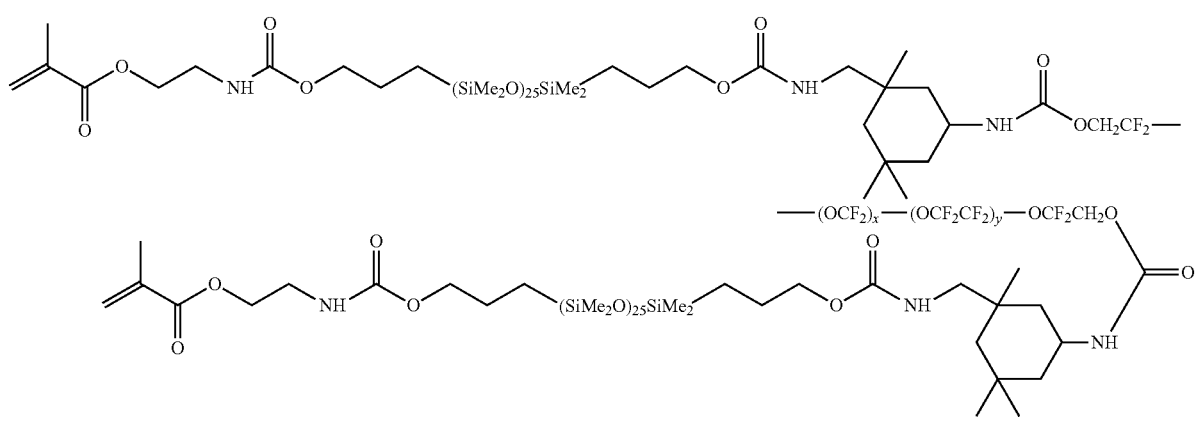

Other silicone containing components suitable for use in this invention include macromers containing polysiloxane, polyalkylene ether, diisocyanate, polyfluorinated hydrocarbon, polyfluorinated ether and polysaccharide groups; polprovide two distinct and isolated electrical contact points. It may be obvious to one skilled in the art that there are various other means to encapsulate an Energy Source which may be consistent with the art detailed herein.

There may be numerous embodiments relating to the method of forming an energized ophthalmic device of the various types that have been described. In one set of embodiments, the inventive art herein may include assembling subcomponents of a particular energized ophthalmic lens embodiment in separate steps. The "off-line" assembly of advantageously shaped thin film microbatteries, flexible circuits, interconnects, microelectronic components, and/or other electroactive components in conjunction with a biocompatible, inert, conformal coating to provide an all-inclusive, embeddable singular package that can be incorporated into known cast molding contact lens manufacturing processes. Flexible circuits may include those fabricated from copper clad polyimide film or other similar substrates.

Conformal coatings may include, but are not limited to, parylene (grades N, C, D, HT, and any combinations thereof), poly(p-xylylene), dielectric coatings, silicone conformal coatings, polyurethane conformal coatings, acrylic conformal coatings, rigid gas permeable polymers, or any other advantageous biocompatible coatings.

Some embodiments of the present invention include methods that are directed toward the geometric design of thin film microbatteries in geometries amenable to the embedment within and/or encapsulation by ophthalmic lens materials. Other embodiments include methods for incorporating thin film microbatteries in various materials such as, but not limited to, hydrogels, silicone hydrogels, rigid gas-permeable "RGP" contact lens materials, silicones, thermoplastic polymers, thermoplastic elastomers, thermosetting polymers, conformal dielectric/insulating coatings, and hermetic barrier coatings.

Still other embodiments involve methods for the strategic placement of an Energy Source within an ophthalmic lens geometry. Specifically, in some embodiments the Energy Source may be an opaque article. Since it is preferable for the Energy Source to not obstruct the transmission of light through an optic zone of the ophthalmic lens, methods of design in some embodiments may ensure that an optic zone comprising a central 5-8 mm of the contact lens is not obstructed by any opaque portions of the Energy Source or supporting circuitry or other components.

In some embodiments the mass and density of the Energy Source may facilitate designs such that said Energy Source may also function either alone or in conjunction with other lens stabilization zones designed into the body of the ophthalmic lens to rotationally stabilize the lens while on eye. Such embodiments could be advantageous for a number of applications including, but not limited to, correction of astigmatism, improved on-eye comfort, or consistent/controlled location of other components within the energized ophthalmic lens.

In additional embodiments, the Energy Source may be placed a certain distance from the outer edge of the contact lens to enable advantageous design of the contact lens edge profile in order to provide good comfort while minimizing occurrence of adverse events. Examples of such adverse events to be avoided may include superior epithelial arcuate lesions or giant papillary conjunctivitis.

By way of non-limiting example in some embodiments, a cathode, electrolyte and anode features of embedded electrochemical cells may be formed by printed appropriate inks in shapes to define such cathode, electrolyte and anode regions. It may be apparent that batteries thus formed could include both single use cells, based for example on manganese oxide and zinc chemistries, and rechargeable thin batteries based on lithium chemistry similar to the above mentioned thin film battery chemistry. It may be apparent to one skilled in the arts that a variety of different embodiments of the various features and methods of forming energized ophthalmic lenses may involve the use of printing techniques.

There may be numerous embodiments relating to apparatus that may be used to form energized ophthalmic lens embodiments with the various methods that have been discussed. A fundamental step in the processing may relate to supporting the various components comprising an ophthalmic lens Energy Source while the body of the ophthalmic lens is molded around these components. In some embodiments the Energy Source may affixed to holding points in a lens mold. The holding points may be affixed with polymerized material of the same type that will be formed into the lens body. It may be apparent to one skilled in the art, that numerous manners of supporting the various Energy Sources before they are encapsulated into the lens body comprise embodiments within the scope of this invention.

As mentioned above, in some embodiments of the present invention the Energy Source includes an electrochemical cell or battery. There are many different types of batteries which may be included in embodiments of energized ophthalmic lenses. For example, single use batteries may be formed from various cathode and anode materials. By way of non-limiting examples these materials may include Zinc, carbon, Silver, Manganese, Cobalt, Lithium, Silicon. Still other embodiments may derive from the use of batteries that are rechargeable. Such batteries may in turn be made of Lithium Ion technology; Silver technology, Magnesium technology, Niobium technology. It may be apparent to one skilled in the art that various current battery technologies for single use or rechargeable battery systems may comprise the Energy Source in various embodiments of an energized ophthalmic lens.

The physical and dimensional constraints of a contact lens environment may favor certain battery types over others. An example of such favorability may occur for thin film batteries. Thin film batteries may occupy the small volume of space consistent with human ophthalmic embodiments. Furthermore, they may be formed upon a substrate that is flexible allowing for the body of both the ophthalmic lens and included battery with substrate to have freedom to flex.

In the case of thin film batteries, examples may include single charge and rechargeable forms. Rechargeable batteries afford the ability of extended usable product lifetime and, therefore, higher energy consumption rates. Much development activity has focused on the technology to produce electrically energized ophthalmic lenses with rechargeable thin film batteries; however, the inventive art is not limited to this subclass.

Rechargeable thin film batteries are commercially available, for example, Oak Ridge National Laboratory has produced various forms since the early 1990s. Current commercial producers of such batteries include Excellatron Solid State, LLC (Atlanta, Ga.), Infinite Power Solutions (Littleton, Colo.), and Cymbet Corporation, (Elk River, Minn.). The technology is currently dominated by uses that include flat thin film batteries. Use of such batteries may comprise some embodiments of this inventive art; however, forming the thin film battery into a three dimensional shape, for example with a spherical radius of curvature comprises desirable embodiments of the inventive art. It may be clear to one skilled in the art that numerous shapes and forms of such a three dimensional battery embodiment are within the scope of the invention.

Figure 6:
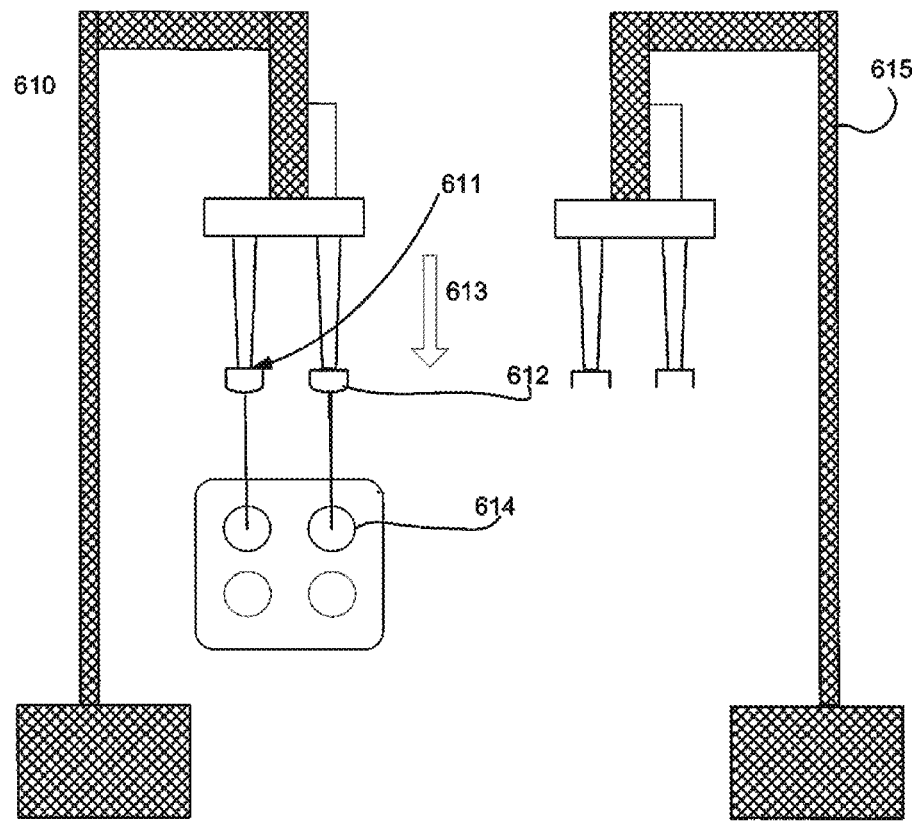
FIG. 6 illustrates a depiction of apparatus and automation that may be used to implement some embodiments of the present invention.

Referring now to FIG. 6, apparatus for applying a binder layer to a mold part is illustrated. The apparatus includes first automation 610 which is capable of positioning a binder coat applicator 611-612 proximate to one or more mold parts 614 and apply a binder coat into the one or more mold parts. In some embodiments, the binder coat applicators 611-612 will move in a vertical direction to become proximate to the one or more mold parts 614. The binder layer applicator may include for example one or more of: a pad printing device and an ink jet mechanism. Applications of coatings, such as those used for the application of colorant into a contact lens or other cosmetic tinting of contact lenses are well known. In the present invention, methods and apparatus for the application of colorant into a contact lens can be adapted to also introduce a binder layer into a mold part which is capable of adhering an Energy Source or other component to the mold part.

Second automation 615 for placing one or more of: the Energy Source and other components into the mold part can also be proximate to the mold part 614.

Figure 7:
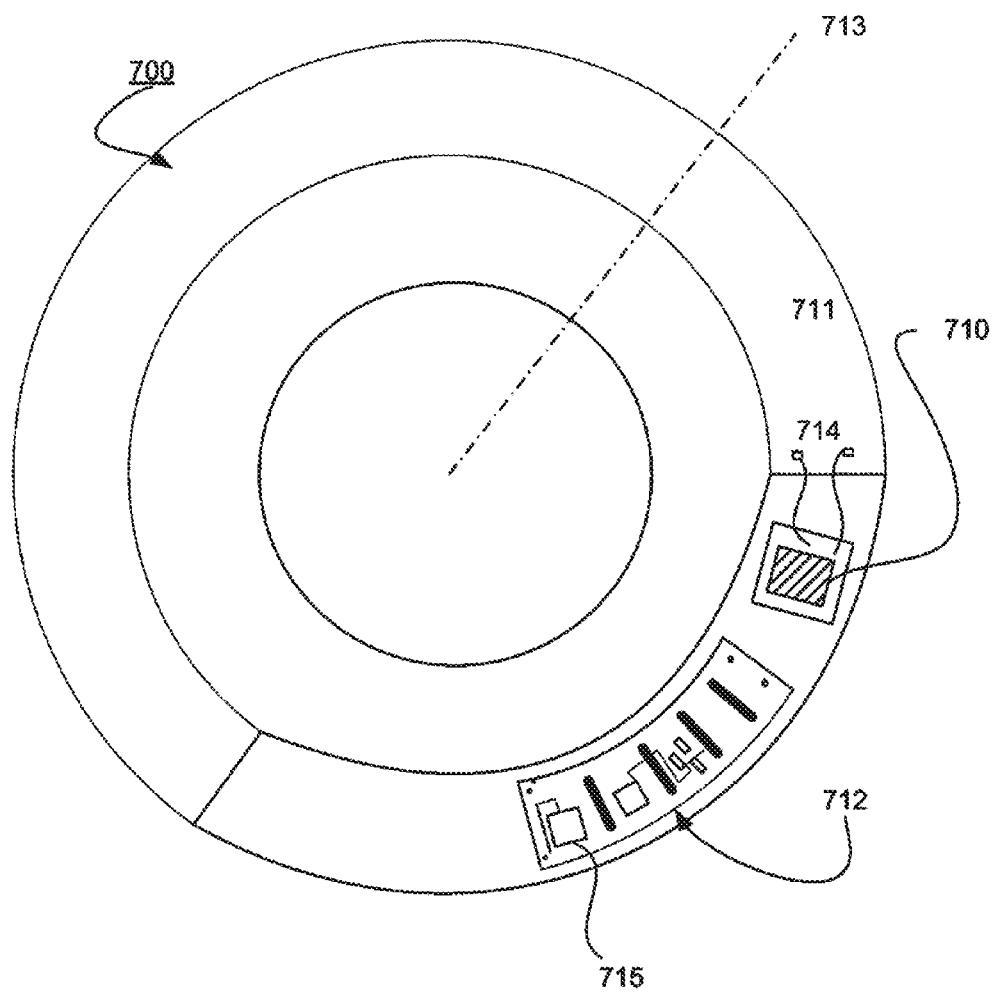
FIG. 7 illustrates an ophthalmic lens with an energy source and components.

Referring now to FIG. 7 Referring to FIG. 7, a top down depiction of an exemplary embodiment of an ophthalmic lens 700 with and Energy Source 710 and components 712, 714, and 715 is shown. In this depiction, an Energy Source 710 is shown in a periphery portion 711 of the ophthalmic lens 700. The Energy Source 710 may include, for example, a thin film, rechargeable lithium ion battery. The Energy Source 710 may be connected to contact points 714 to allow for interconnection. Wires may be wire bond wires to the contact points 714 and connect the Energy Source 710 to a photoelectric cell 715 which may be used to reenergize the battery Energy Source 710. Additional wires may connect the Energy Source 710 to a flexible circuit interconnect via wire bonded contact.

In some embodiments, the ophthalmic lens 700 may also include a flexible substrate onto which the Energy Source 710 and components 712, 714, and 715 are mounted. This flexible substrate may be formed into a shape approximating a typical lens form in a similar manner previously discussed. Various electronic components 712 such as integrated circuits, discrete components, passive components and such devices may also be included.

An optic zone 713 is also illustrated. The optic zone may be optically passive with no optical change, or it may have a predetermined optical characteristic, such as a predefined optical correction. Still other embodiments include an optical zone with a variable optic component that may be varied on command.

In some embodiments, an ophthalmic lens with a component, such as processor device can be matched with an Energy Source 710 incorporated into an ophthalmic lens and used to perform logical functions or otherwise process data within the ophthalmic lens.

Figure 8:
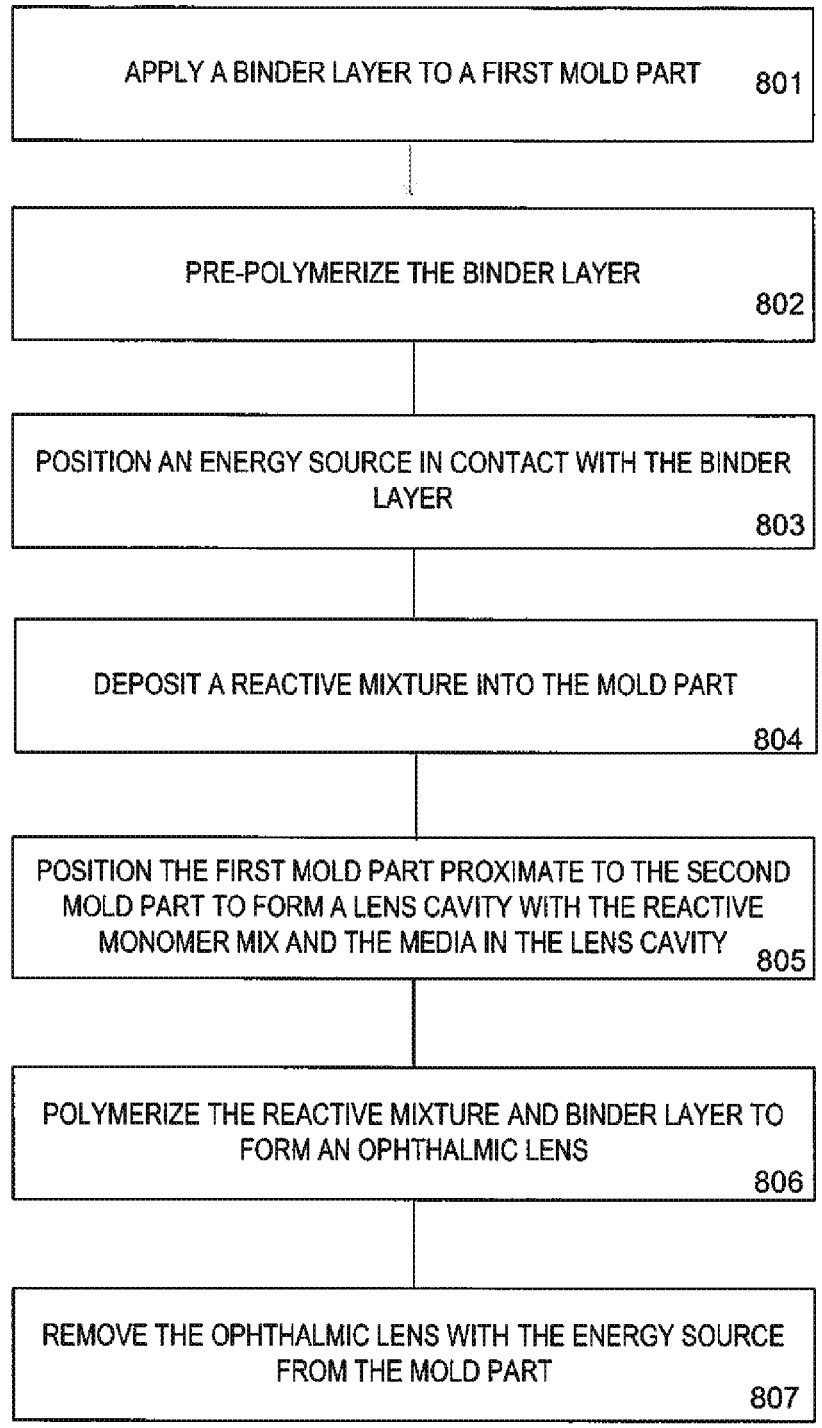
FIG. 8 illustrates method steps that may be implemented in practicing the present invention.

Referring now to FIG. 8, some method steps are listed that may be implemented according to some embodiments of the present invention. The method steps are exemplary and should not limit the scope of invention in that all or some may be implemented in a claimed invention. At 801, a binder layer is applied to a first mold part. At 802, the binder layer may be pre-polymerized to create a tackiness on the binder layer. The tackiness may make the binder layer more conducive to receiving and binding an Energy Source to the binder layer. At 803, an energy source is positioned in contact with the binder layer, generally within the parameters of the first mold part. The mold part is thereby adhered to the first mold part via the binder layer. At 804 a Reactive Mixture is deposited into the first mold part.

At 805, a second mold part is placed proximate to the first mold part and a lens forming cavity is thereby formed with the Energy Source and the binder layer included within the cavity and the Reactive Mixture generally filling the cavity in a shape of an ophthalmic lens. At 806, the Reactive Mixture is polymerized in the shape of an ophthalmic lens defined by the cavity. Polymerization is accomplished, for example, via exposure to actinic radiation. The Energy Source is now incorporated within the polymerized lens material. At 807, the ophthalmic lens with the Energy Source is removed from the mold parts.

CONCLUSION

The present invention, as described above and as further defined by the claims below, provides methods of processing ophthalmic lenses and apparatus for implementing such methods, as well as ophthalmic lenses formed thereby.

What is claimed is:

1. A method of forming an energized contact lens, the method comprising:
preparing a binder material having a viscosity of from about 4,000 to about 15,000 centipoise;
applying a binder layer of the binder material to a first mold part;
pre-polymerizing the binder layer to create tackiness;
positioning an energy source onto the binder layer applied to the first mold part thereby holding the energy source in position within the first mold part during formation of the energized contact lens;
depositing a reactive mixture into the first mold part;
placing a second mold part proximate to the first mold part forming a cavity therebetween with the energy source held in place by the binder within the cavity; and
polymerizing the reactive mixture to form an energized contact lens comprising polymerized lens reactive mixture and a binder layer at least partially in contact with the energy source.

2. The method of claim 1 wherein the binder layer comprises a polymer capable of forming an interpenetrating polymer network with the polymerized lens reactive mixture.

3. The method of claim 1 wherein the energy source is attached to a flexible substrate and the positioning of the energy source onto the binder layer places the flexible substrate in physical communication with the binder layer at a location that will be outside of an optic zone of the energized contact lens.

4. The method of claim 1 additionally comprising the steps of:
defining an area comprising an optic zone and an area outside of the optic zone; and placing the energy source in the area outside the optic zone.

5. The method of claim 1 wherein the binder layer comprises one or both of: a homopolymer and a copolymer.

6. The method of claim 1 wherein the binder material comprises polymers, copolymers or mixtures thereof having functional groups that render the polymers and copolymers capable of interactions with each other.

7. The method of claim 1 additionally comprising the step of: positioning one or more electrical current drawing components onto the binder layer proximate to the energy source, wherein the energy source comprises an attachment area for connecting the energy source to the one or more electrical current drawing components.

8. The method of claim 7 additionally comprising positioning a reenergizing component onto the binder layer.

9. The method of claim 8 wherein the reenergizing component comprises at least one of: a photoelectric device, a radio frequency absorbing device, an inductive energy coupling device, a capacitive energy coupling device, a thermoelectric device and a piezeoelectric device.

10. The method of claim 9 wherein the reenergizing component directly provides energy to the energy source.

11. The method of claim 9 wherein the reenergizing component provides energy that is modified by an energy characteristic altering device.

12. The method of claim 11 wherein the reenergizing component comprises a photoelectric device.

13. The method of claim 1 wherein the energy source is a lithium ion battery.

14. The method of claim 13 wherein the lithium ion battery is rechargeable.

15. The method of claim 13 wherein the lithium ion battery is a single use battery.

16. The method of claim 1 wherein the energy source comprises at least one of: fuel cells, capacitors, piezoelectrics or photoelectrics.

17. The method of claim 13 wherein the lithium ion battery is encapsulated.

18. The method of claim 13 wherein the lithium ion battery is shaped into a full annular shape.

19. The method of claim 13 wherein the lithium ion battery is shaped into a partial annular shape.

20. The method of claim 13 wherein the lithium ion battery is less than 500 microns thick.

21. The method of claim 1 wherein the energy source comprises a semiconductor material.

22. The method of claim 7 wherein each of the one or more electrical current drawing components comprise constituents that have been printed.

23. The method of claim 6 wherein the binder material comprises a mixture of one or more polymers having a positive charge with one or more polymers having a negative charge.

24. The method of claim 6 wherein the binder material comprises a mixture of a methacrylic acid and 2-hydroxyethylmethacrylate copolymer with a 2-hydroxyethylmethacrylate and 3-(N, N-dimethyl) propyl acrylamide copolymer.

25. The method of claim 6 wherein the binder material comprises from about 93 to about 100 percent by weight 2-hydroxyethylmethacrylate, from about 0 to about 2 percent by weight methacrylic acid, and from about 0 to about 5 percent by weight lauryl methacrylate.

26. The method of claim 25 wherein the binder material polymers have a molecular weight of from about 17,000 to about 35,000.

27. The method of claim 25 wherein the binder material further comprises isopropyl lactate, 1-ethoxy-2-propanol and a low boiling solvent having a boiling point from about 75° C. to about 120° C.

28. The method of claim 27 wherein said low boiling solvent is selected from the group consisting of 1-propanol, 2-propanol, 1-methoxy-2-propanol and combinations thereof.

* * * * *